Figure 3:
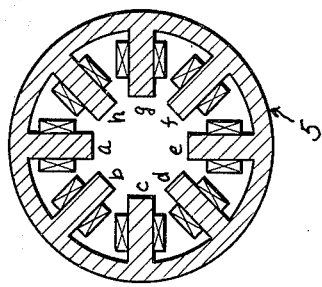

United States Patent [19]
Harada et al.

[11] 3,952,198
[45] Apr. 20, 1976

[54] ELECTRON LENS

[75] Inventors: Yoshiyasu Harada, both of Akishima; Teruo Someya, both of Tokyo, Japan

[73] Assignee: Nihon Denshi Kabushiki Kaisha, Tokyo, Japan

[22] Filed: Aug. 26, 1974

[21] Appl. No.: 500,625

[30] Foreign Application Priority Data
Sept. 3, 1973    Japan.............................. 48-99088

[52] U.S. Cl........................... 250/396 ML; 250/397
[51] Int. Cl.² ......................................... H01J 37/26
[58] Field of Search .......... 250/396, 397, 398, 311, 250/310, 309, 307

[56]     References Cited
         UNITED STATES PATENTS
2,919,381   12/1959   Glaser................................. 250/396
3,201,631   8/1965    Gale.................................... 250/396

Primary Examiner—Craig E. Church
Attorney, Agent, or Firm—Webb, Burden, Robinson & Webb

[57]     ABSTRACT

An electron lens system comprising a plurality of quadrupole elements, a plurality of octupole elements for correcting the spherical aberrations of said plurality of quadrupole elements, and an axially symmetric lens, arranged at the inlet or outlet side of said quadrupole and octupole elements for varying the focal length of said lens system so that the excitation currents of said plurality of quadrupole elements remain fixed.

3 Claims, 8 Drawing Figures

ELECTRON LENS

In an electron beam apparatus utilizing an electron probe such as a scanning electron microscope or an X-ray micro-analyzer, it is important to decrease the diameter and increase the current intensity of the electron beam.

As the diameter of the beam is reduced, however, the current intensity of the electron beam decreases due to spherical aberration in the irradiation lens with the result that it becomes difficult to increase the intensity of the beam (often referred to as probe or pencil). It is therefore necessary to provide a means for correcting said spherical aberration. Lens systems combining a plurality of quadrupole and octupole lens elements are known. Even though electron lenses using quadrupole elements exhibit axial asymmetry, the addition of three or more octupole elements makes it theoretically possible to correct the spherical aberration. In this case, the quadrupole or octupole lens elements can either be electrostatic or magnetic.

Practically speaking, however, these systems have drawbacks. For example, it is necessary to vary the excitation of the respective quadrupole elements substantially in order to change the focal length of the lens. Moreover, if in order to achieve this substantial variation of excitation, a ferro-magnetic substance is used as a coil bobbin for the quadrupole elements, aberrations, optical axis lag and other problems manifest themselves due to hysteresis of the magnetic substance. These porblems could of course by obviated by using an air-core coil. But, by so doing, an excitation intensity of four to five times that required for an iron-core coil would be required, thus requiring such measures as water cooling to counteract the possibility of damage caused by the resultant generated heat.

Briefly, according to this invention, an electron lens system comprises a plurality of quadrupole elements, a plurality of octupole elements for correcting spherical aberrations and at least one axially symmetric lens arranged at the inlet or outlet side of said quadrupole and octupole elements for varying the focal length of said lenses such that the excitation currents of said plurality of quadrupole elements remains fixed.

Accordingly, it is an advantage of this invention to provide a lens system for correcting the spherical aberration by easy adjustment of the lens excitation currents. Another advantage of this invention is to provide a lens system for correcting the spherical aberration without optical axis lag.

Figure 1:
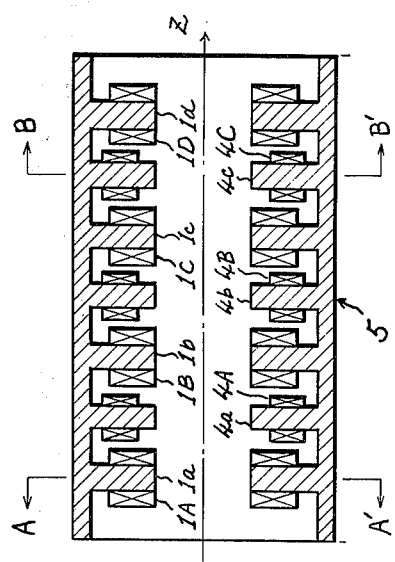
Figure 2:
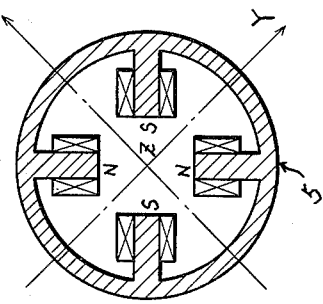
Figure 4:
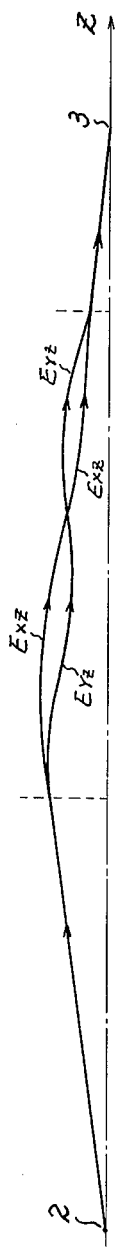

Other objects and advantages of this invention will be apparent by reading the following description in conjunction with the accompanying drawings of which:

FIG. 1 is a cross-sectional view of a prior art electron lens system combining four quadrupole lens elements and three octupole lens elements, FIGS. 2 and 3 are axial cross-sectional views of A—A' and B—B' in the lens system shown in FIG. 1, FIG. 4 is a diagram showing the trajectory of the electron beam in the lens system shown in FIG. 1, and FIGS. 5, 6 and 7 are schematic diagrams showing embodiments of this invention.

Referring to FIGS. 1, 2, and 3, four quadrupole elements, which are composed of excitation coils 1A, 1B, 1C, 1D, respectively wound around magnetic coil bobbins, 1a, 1b, 1c, and 1d are excited so as to have the same polarity at opposite poles as shown in FIG. 2. By so doing, the trajectory of electron beam Exz projected onto the XZ plane and that of electron beam Eyz projected onto the YZ plane are shown in FIG. 4. Thus, the trajectory within the pole elements is controlled so that all the electron trajectories from the same object point 2 form an image at the same focusing position 3. Moreover, the spherical aberration of the lens can be corrected by controlling the magnetic field produced by the three octupole elements arranged in the axially asymmetric electron beam trajectory area, i.e. coils 4A, 4B and 4C, wound around magnetic coil bobbins $4a$, $4b$ and $4c$. The respective octupole elements are excited so that the poles, when defined counterclockwise, viz., $a$, $b$, $c$, $d$, $e$, $f$, $g$, $h$, are alternately north or south as shown in FIG. 3.

As stated above, although in theory it is possible to correct the spherical aberration using the lens system as described in the aforegoing, the practicle feasibility of such a system is uncertain.

Figure 5:
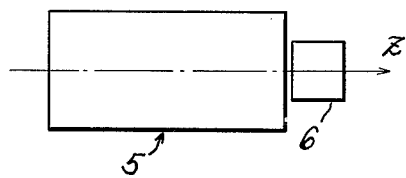

FIG. 5 shows one embodiment of this invention in which a weak axially symmetric lens 6 is provided at the beam outlet side of the arrangement 5 in FIG. 1. The image-forming position in this embodiment can be changed by adjusting the excitation current of lens 6. Also, the octupole elements can be controlled so as to cancel out the sum of the spherical aberrations of the quadrupole elements and the lens 6. In this embodiment it is almost unnecessary to vary the excitation of the quadrupole elements and octupole elements when changing the image-forming position, thereby simplifying the control thereof.

Further, in the interests of weak lens function and ease of construction, axially symmetric lens 6 as shown in FIG. 5, is an air-core solenoid type lens, which can be effectively used, since it is not subject to hysteresis effects. Also, lens cooling is easy to carry out compared to the case of the quadrupole lens arrangement.

Figure 6:
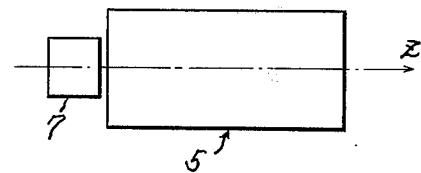

In the embodiment shown in FIG. 6, an axially symmetric lens 7 is provided at the beam inlet side of the arrangement 5. The image-forming position or the electron beam probe can also be changed by adjusting the excitation current of lens 7. Moreover, the electron beam projected onto the arrangement 5 can be made to pass through the region close to the optical axis by means of lens 7 thereby reducing the spherical aberration. As a result, aberration correction can be carried out more effectively.

Figure 7:
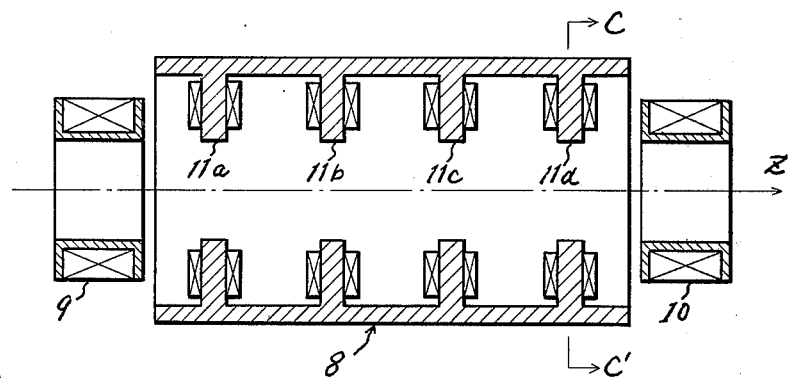

FIG. 7 shows an embodiment of this invention in which solenoid lenses 9 and 10 are provided at the beam inlet and outlet side of the lens arrangement 8 composed of quadrupole and octupole elements respectively. The lens 9 determines the direction of the incident electron beam and lens 10 freely adjusts the image-forming position thereof. Accordingly, the electron beam trajectory is adjusted by these two lenses, thereby eliminating the complicated adjustment of the quadrupole lens arrangement. That is to say, it is sufficient to use the quadrupole lens arrangement only for making the trajectory of the passing electron beam axially asymmetric. Thus, the arrangement 8 can be fixed at a certain excitation current. Moreover, since in the quadrupole lens arrangement, the electron beam always passes through the region close to the optical axis due to the action of lens 9, the sufficient lens intensity can be obtained by weak excitation current. Such being the case, non-magnetic coil bobbins can be used for the octupole lens and the coils of the quadrupole elements can be wound around the same bobbins so as to overlap the graudrupole lens coils. The lens arrangement 8 shown in FIG. 7 is composed as described above wherein eight non-magnetic bobbins axially asymmetric with respect to the optical axis Z are provided in four stages (11a, 11b, 11c, 11d) along the optical axis Z.

Figure 8:
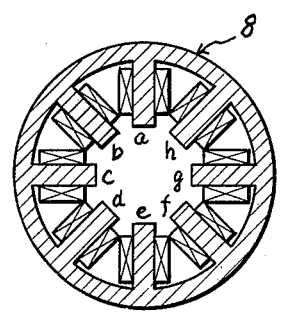

FIG. 8 shows an axial cross-section view of C—C' in FIG. 7. In the figure, the octupole elements are wound around bobbins a, b, c, d, e, f, g, and h so that the respective magnetic poles lie alternately N and S and the quadrupole elements are wound around the bobbins so as to overlap the above element. The quadrupole elements are wound so as to form the same magnetic poles in respective pairs, viz., a and b, c and d, e and f, and g and h. In addition, the magnetic poles of the respective pairs lie alternately N and S. It goes without saying that the quadrupole lens arrangement and octupole elements can be controlled independently.

This invention is not restricted to the above embodiments. For example, it is sufficient to use two or more quadrupole elements and three or more octupole elements in the spherical aberration correction lens system.

Having thus described our invention with the detail and the particularity as required by the patent laws, what is desired protected by Letters Patent is set forth in the following claims.

What is claimed is:

1. An electron lens system comprising a plurality of quadrupole elements, a plurality of octupole elements for correcting the spherical aberrations of said plurality of quadrupole elements, and an axially symmetric lens arranged adjacent said quadrupole and octupole elements, means for varying the intensity of the axially symmetric lens while maintaining the intensities of the quadrupole and octupole elements substantially constant thus varying the focal length of said system.

2. An electron lens system comprising a plurality of quadrupole elements, a plurality of octupole elements for correcting the spherical aberration of said plurality of quadrupole elements, and two axially symmetric lenses, arranged at the inlet and outlet of said quadrupole and octupole elements, respectively, means for varying the intensity of the axially symmetric lenses while maintaining the intensities of the quadrupole and octupole elements substantially constant thus varying the focal length of said system.

3. An electron lens system according to claim 2 in which the excitation of one symmetric lens arranged at the inlet of said quadrupole and octupole elements is fixed and the excitation of other symmetric lens arranged at the outlet of said quadrupole and octupole elements is adjustable for varying the focal length of said system.

* * * * *